(12) United States Patent
Chen

(10) Patent No.: US 6,927,410 B2
(45) Date of Patent: Aug. 9, 2005

(54) MEMORY DEVICE WITH DISCRETE LAYERS OF PHASE CHANGE MEMORY MATERIAL

(75) Inventor: Bomy Chen, Cupertino, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 0 days.

(21) Appl. No.: 10/656,668

(22) Filed: Sep. 4, 2003

(65) Prior Publication Data
US 2005/0051901 A1 Mar. 10, 2005

(51) Int. Cl.[7] .................................... H01L 47/00
(52) U.S. Cl. ............... 257/2; 257/4; 257/5; 438/95; 438/98; 438/102
(58) Field of Search .................... 438/95, 98, 102; 257/2, 4, 5

(56) References Cited

U.S. PATENT DOCUMENTS

| | | |
|---|---|---|
| 5,536,947 A | 7/1996 | Klersy et al. |
| 6,087,674 A | 7/2000 | Ovshinsky et al. |
| RE37,259 E | 7/2001 | Ovshinsky |
| 6,511,862 B2 | 1/2003 | Hudgens et al. |

Primary Examiner—Long Pham
(74) Attorney, Agent, or Firm—DLA Piper Rudnick Gray Cary US LLP (57) ABSTRACT

A phase changing memory device, and method of making the same, that includes programmable memory material disposed between a pair of electrodes. The programmable memory material includes discrete layers of phase change material, separated by conductive interface layers, that exhibits relatively stable resistivity values over discrete ranges of crystallizing and amorphousizing thermal pulses applied thereto, for multi-bit storage. The memory material and one of the electrodes can be disposed along spacer material surfaces to form an electrical current path that narrows in width as the current path approaches the other electrode, such that electrical current passing through the current path generates heat for heating the memory material disposed between the electrodes.

27 Claims, 7 Drawing Sheets

MEMORY DEVICE WITH DISCRETE LAYERS OF PHASE CHANGE MEMORY MATERIAL

FIELD OF THE INVENTION

The present invention relates to phase change memory devices, and more particularly to phase change memory devices employing discrete and separated layers of phase change material.

BACKGROUND OF THE INVENTION

There are many types of computer memory technologies that are presently used to store computer programs and data, including dynamic random access memory (DRAM), static random access memory (SRAM), erasable programmable read-only memory (EPROM), and electrically erasable programmable read only memory (EEPROM), etc. Some memory technologies require electrical power to maintain the stored data (i.e. volatile memory), while others do not (i.e. non-volatile memory). Memory technologies can be read only, write once only, or repeatedly read/write.

There is an increasing demand for repeatedly read/write, non-volatile memory. The primary non-volatile memory technology presently used is EEPROM, which utilizes floating gate field effect transistor devices each holding a charge on an insulated "floating gate". Each memory cell can be electrically programmed with one of two possible "bit values" (e.g. a "1" or a "0") by injecting or removing electrons onto or from the floating gate. However, EEPROM memory cells are getting more difficult to scale down to smaller sizes, are relatively slow to read and program, and can consume a relatively large amount of power.

Phase change memory devices have also been known for some time. These devices use memory materials that can be electrically switched (programmed) between different structured states that exhibit different electrical read-out properties. For example, memory devices made of a chalcogenide material are known, where the chalcogenide material is programmed between a generally amorphous state that exhibits a relatively high resistivity, and a generally crystalline state that exhibits a relatively low resistivity. The chalcogenide material is programmed by heating the material, whereby the amplitude and duration of the heating dictates whether the chalcogenide is left in an amorphous or crystallized state. The high and low resistivities represent programmed bit values of "1" and "0", which can be sensed by then measuring the resistivity of the chalcogenide material. Phase change memory devices have a high program speed (e.g. 200 ns), and exhibit great endurance and program retention.

Figure 1:
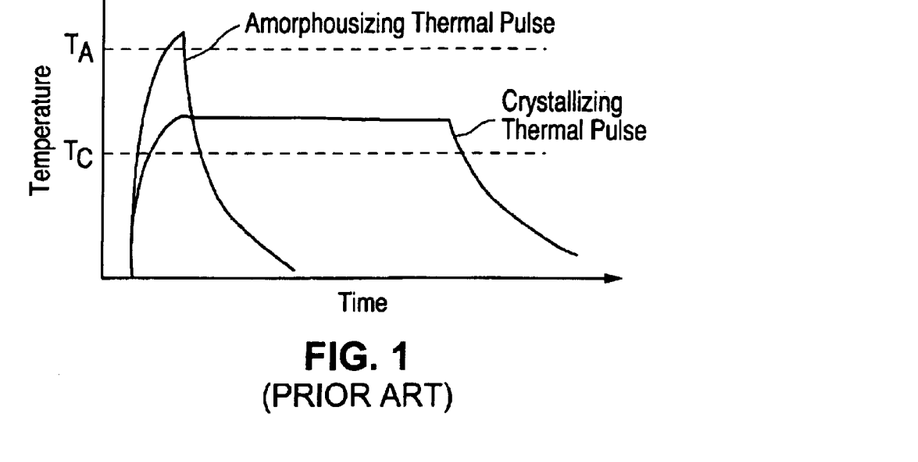
FIG. 1 is a graph illustrating amorphousizing and crystallizing phase change memory materials.

FIG. 1 is a graphical representation of how phase change material is programmed with either a relatively high or relatively low resistivity. To amorphousize the phase change material, a short and high amplitude thermal pulse (amorphousizing thermal pulse) is applied to the phase changing material so that it reaches a temperature beyond its amorphousizing temperature $T_A$. Once this temperature is reached, the volume of phase change material is rapidly cooled by removing the thermal pulse. So long as the phase change material is cooled faster than the rate at which it can crystallize, the phase change material is left in a relatively high-resistivity amorphous state. To crystallize the phase change material, a longer and lower amplitude thermal pulse (crystallizing thermal pulse) is applied to the phase change material so that it reaches a temperature beyond its crystallization temperature $T_C$, and is maintained above that temperature for a sufficient time to allow the phase change material to crystallize. After such time, the thermal pulse is removed, and the phase change material is left in a relatively low-resistivity crystallized state.

Figure 2A:
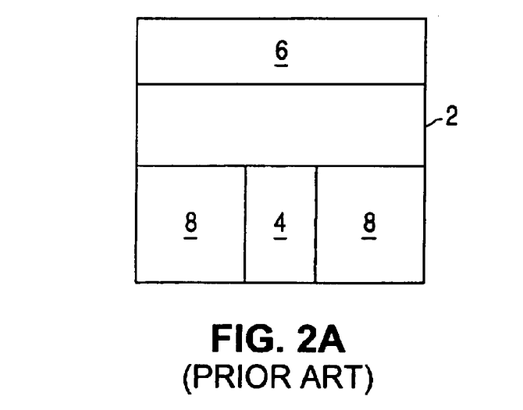
FIG. 2A is a cross-sectional view of a conventional phase change memory device.
Figure 2B:
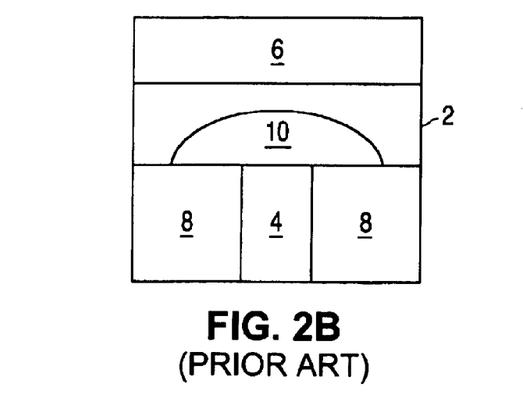
FIG. 2B is a cross-sectional view of the conventional phase change memory device, after undergoing a crystallizing thermal pulse.

FIG. 2A illustrates a memory cell employing chalcogenide phase change memory material. The memory cell includes a layer of chalcogenide 2 disposed between a pair of electrodes 4/6, and over thermal insulator material 8. One of the electrodes (in this case the lower electrode 4) has an increased resistivity making it a thermal heater that heats the chalcogenide layer 2 when an electrical current is passed through the electrodes 4/6 (and through the chalcogenide layer 2). FIG. 2A, for example, shows the chalcogenide 2 in its amorphous state in which the material is highly resistive. When heated by electrode 4 by a crystallizing thermal pulse, at least a portion 10 of the chalcogenide layer 2 is crystallized, as shown in FIG. 2B, which decreases the electrical resistance of the chalcogenide material. The chalcogenide 2 can be amorphousized back to its higher resistive state by applying an amorphousizing thermal pulse. The electrical resistance of this memory cell is read using a small electrical current that does not generate enough heat to reprogram the chalcogenide material.

It is even possible to program phase change memory material with varying degrees of amorphousization/crystallization to produce varying degrees of resistivity, so that more than two possible bit values can be stored in a single memory cell (multi-bit storage). For example, the longer the crystallizing thermal pulse, the more of the phase change material that is crystallized (i.e. the larger portion 10 becomes), and the lower the resistance of the memory material. By programming the memory material at various detectable degrees of amorphousization/crystallization, each with a different and detectable resistivity value (or range of values), multi-bit storage memory cells can be utilized.

It is known to make multi-bit memory devices with heterogeneous and homogeneous mixtures of phase change and dielectric materials. See for example U.S. Pat. Nos. 5,536,947, RE 37,259 and 6,087,674, which are incorporated herein by reference. These patents recognize that the resistance of the memory material may drift, possibly outside a selected margin of error, which would result in a loss of stored data. Compositional modification (e.g. grading the memory material from one phase change material to another) and/or layering the memory material (e.g. with discrete thin layers of memory material of different compositions), are proposed to reduce resistance drift.

It can be difficult to accurately and repeatedly program multi-bit phase change memory cells with the desired degree of crystallization, to produce the desired resistance value(s). On a microscopic scale, the properties of phase change material can be difficult to control and anticipate, especially if there is any resistance drift.

There is a need for high resolution, high reliability, multi-bit phase change memory devices.

SUMMARY OF THE INVENTION

The present invention solves the aforementioned problems by the discovery that discrete layers of phase change memory material, that are separated by lattice mismatch interface materials, produce quantized resistivities that are more reliably and more repeatedly programmable.

In one aspect of the present invention, a phase change memory device includes a volume of memory material having a plurality of discrete layers of phase change material, and a discrete layer of interface material disposed between each pair of adjacent phase change material layers, wherein the interface material is formed of a lattice mismatch material relative to the phase change material, and means for applying heat to the memory material volume. The resistivity of the memory material is programmable to one of a plurality of generally distinct resistivity values in response to the heat applied to the memory material.

In another aspect of the present invention, a phase change memory device includes a plurality of memory cells formed on a substrate. Each of the memory cells includes a volume of memory material that includes a plurality of discrete layers of phase change material, with a discrete layer of interface material disposed between each pair of adjacent phase change material layers, wherein the interface material is formed of a lattice mismatch material relative to the phase change material, a first electrode in electrical contact with the memory material volume, and a second electrode in electrical contact with the memory material volume, wherein the volume of memory material is disposed between the first and second electrodes such that electrical current passing through the first and second electrodes and the memory material volume generates heat that is applied to memory material. The resistivity of the memory material in each of the memory cells is programmable to one of a plurality of generally distinct resistivity values in response to the heat applied thereto.

One more aspect of the present invention is a method of operating a phase change memory device having a volume of memory material that includes a plurality of discrete layers of phase change material and a discrete layer of interface material disposed between each pair of adjacent phase change material layers, wherein the interface material is formed of a lattice mismatch material relative to the phase change material. The method includes applying heat to the memory material volume to form a temperature gradient in the memory material volume for a predetermined amount of time, wherein a resistivity of the memory material is programmed to one of a plurality of generally distinct resistivity values in response to the heat applied to the memory material, and measuring the resistivity of the memory material.

Other objects and features of the present invention will become apparent by a review of the specification, claims and appended figures.

DETAILED DESCRIPTION OF THE PREFERRED EMBODIMENTS

The present invention is an improved, programmable, memory material and a method of making such material, as well as devices that utilize such memory material. The programmable memory material of the present invention includes discrete layers of phase change material, separated by conductive interface layers, that produce quantized levels of resistivity.

Figure 3:
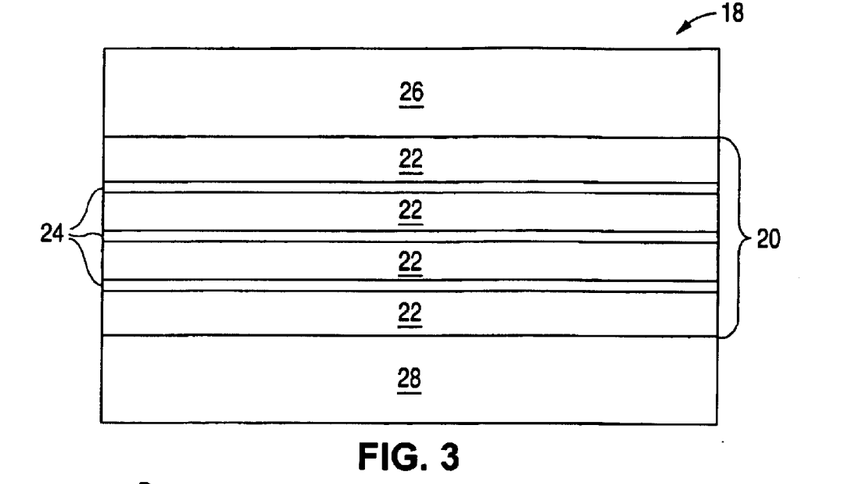
FIG. 3 is a side cross-sectional view of the phase change memory material of the present invention.

FIG. 3 illustrates a basic memory device 18 using programmable memory material 20 of the present invention. The memory material 20 includes a plurality of discrete layers 22 of phase change material, interlaced with a plurality of discrete layers 24 of lattice mismatch interface material. For illustration purposes only, four phase change material layers 22 (e.g. 0.3 to 100 nm thick), separated by three interface layers 24 (e.g. 0.2 to 0.8 nm thick) are shown in FIG. 3, however fewer or greater numbers of layers 22/24 with different thicknesses can be used. Ideally, the number of phase change material layers 22 corresponds to the number of possible bit values storable in the phase change memory device. Upper and lower electrodes 26/28 are formed above and below the programmable memory material 20, respectively, for supplying electrical current (and heat) that programs and reads the memory material 20. Electrodes 26/28 can be formed of any appropriate conductive material (e.g. tungsten, titanium-tungsten, etc.). The conductive material used to form one of the electrodes (e.g. the upper electrode 26) is selected and/or doped (e.g. by ion implant or by in-situ process) for increased resistivity, to enhance the heat generated thereby during operation, as explained in further detail below.

The preferred phase change material is a chalcogenide alloy which includes at least one Group VI element, such as $Ge_2Sb_2Te_5$ (e.g. 2 to 50 nm thick). The interface layers 24 are made of a lattice mismatch material (e.g. 0.2 to 0.8 nm thick) relative to the phase change memory material, which is any material that does not have a structure matching that of the chalcogenide layers it is disposed between. More specifically, the chemical composition, elements and/or structure of the lattice mismatch material are such that the crystalline lattice of the chalcogenide material will not merge with the crystalline lattice (if any) of the lattice mismatch material under the operational temperatures (e.g. 25–600° C.) and electrical currents of the memory device, even under many duty cycles. Such mismatch materials include amorphous materials, crystalline materials having a sufficiently different lattice structure relative to the adjacent polysilicon chalcogenide material (e.g. distance between lattice molecules differs), or any other material that will not merge to form larger grains of polycrystalline with the chalcogenide material, and which exhibits the resistance characteristics of FIG. 5 as discussed in further detail below. Examples of chalcogenide (e.g. $Ge_2Sb_2Te_5$) mismatch materials include amorphous materials, binary alloys having a different lattice structure (e.g. GeTe, $Sb_2Te_3$, etc.), lattice different alloys having a group 4, 5, or 6 element (e.g. GaSb, InSb, InSe, InSbTe, AgInSbTe, (GeSn)SbTE, GeSb(SeTe), etc.), metals (e.g. TiW, W, etc.), and oxygenated or nitrided chalcogenide materials ($GeO_x$, $SbO_y$, $GeN_x$, etc.).

Figure 4A:
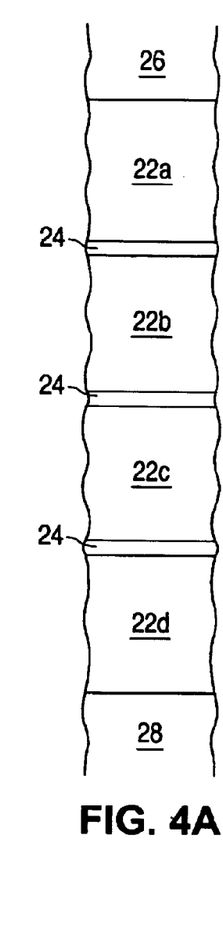
FIGS. 4A–4G are side cross-sectional views showing the sequential crystallization of the various layers of phase change material.
Figure 4B:
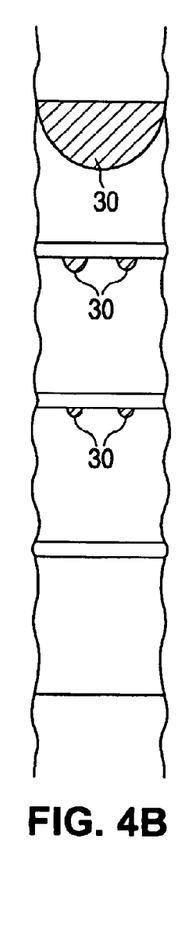
Figure 4C:
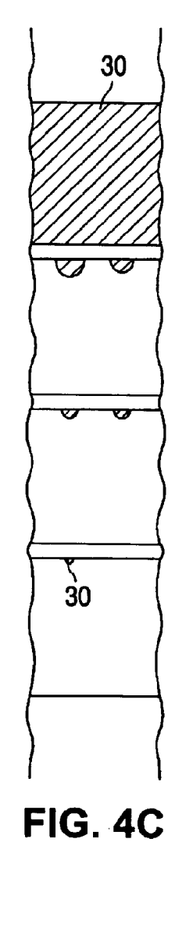
Figure 4D:
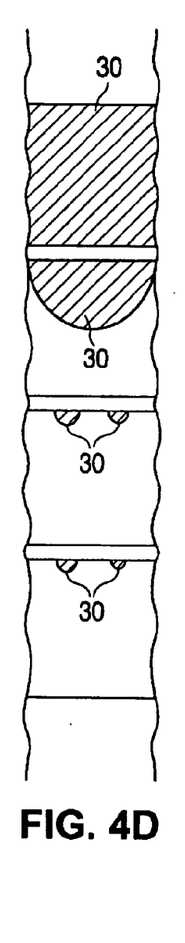
Figure 4E:
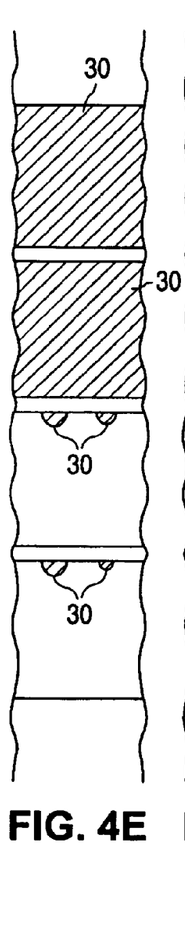
Figure 4F:
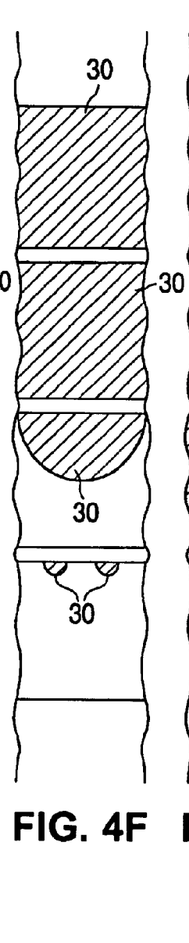
Figure 4G:
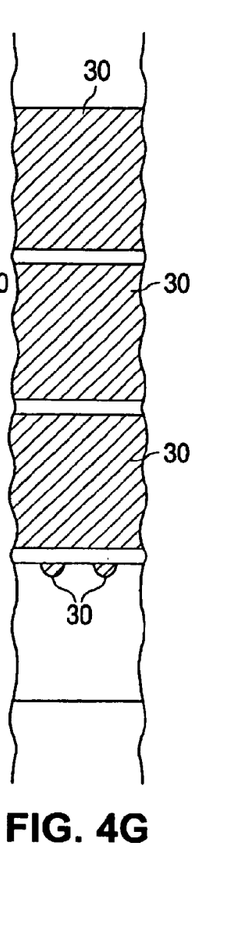

The memory material 20 can be programmed in two ways: via crystallization or via amorphousization. Programming via crystallization is first illustrated in FIGS. 4A–4G, and begins with all phase change material layers 22a–22d in their amorphous states, as shown in FIG. 4A. If needed, a high current (preferably AC) electrical pulse (e.g. 0.1 to 10 msec in length) is passed through the memory device 18 to generate a thermal pulse that amorphousizes all of the phase change material layers 22. A lower amplitude electrical pulse (preferably DC) of longer duration is then passed through the memory device 18, which generates a crystallizing thermal pulse originating mainly from upper electrode 26 (which as been doped or formed to act as a heating element). The crystallizing thermal pulse creates a temperature gradient across the memory material 20, where the various layers 22 are asymmetrically heated (i.e. top layers hotter than bottom layers). Top layer 22a is subjected to the greatest temperature (e.g. 350–450° C.), and the bottom layer 22d is subjected to the lowest temperature (e.g. 270–330° C.). This temperature gradient can be enhanced if lower electrode 28 is made of a thermally conductive material that acts as a heat sink. Over the duration of the crystallizing thermal pulse, the various layers of phase change materials are sequentially crystallized mostly one layer 22 at a time, with a lag time between each layer crystallization. FIGS. 4B–4C illustrate the crystallization of layer 22a, where an area 30 of layer 22a is crystallized, with little crystallization in layers 22b–d. After a lag time, FIGS. 4D–4E illustrate the crystallization of layer 22b, with little crystallization in layers 22c–d. After another lag time, FIGS. 4F–4G illustrate the crystallization of layer 22C, with little crystallization in layer 22d. This process continues until the crystallizing thermal pulse ceases, or all the layers 22 of phase change material have been crystallized.

Figure 5:
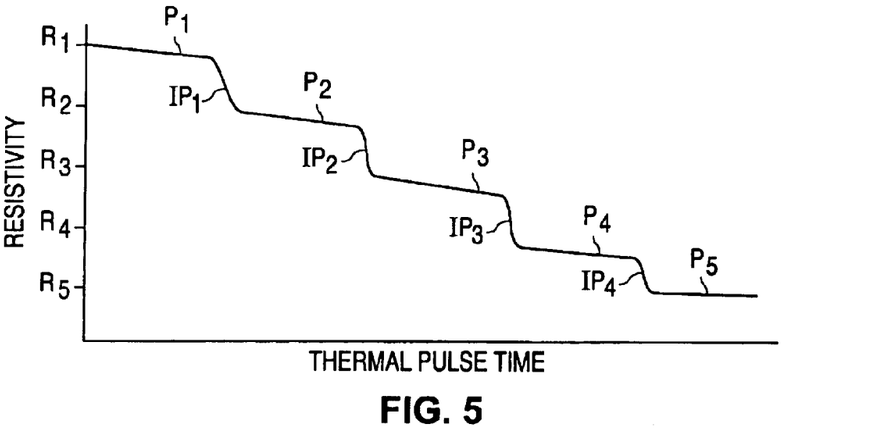
FIG. 5 is a graph showing the resistivity of the memory material of the present invention as a function of the crystallizing thermal pulse time.

The instantaneous resistivity of the memory material 20 during the crystallizing thermal pulse is shown in FIG. 5. The change of resistivity has a relatively flat plateau ($P_n$) for each phase change material layer 22 corresponding to the lag time during which there is a relatively slow rate of crystallization, followed by a sharper inflection point ($IP_n$) corresponding to a faster rate of crystallization that more rapidly envelops each layer 22 of phase change material. In other words, as a steady rate of heating is applied over time to the memory material by the one or more thermal pulses, the memory material exhibits periods of slower crystallization or amorphousization (i.e. at the plateaus $P_n$), and periods of faster crystallization or amorphousization (i.e. at the inflection points $IP_n$). The increase in the crystallization rate is caused by asymmetric seed-assisted polychalcognide grain growth at a sub-melt point, where one layer of chalcogenide will crystallize rather quickly once pockets of crystallization have been formed in that layer occurs, which corresponds to the inflection points. Then, there is a lag time before the next layer of chalcogenide can form pockets of crystallization (due to the presence of the interface layer therebetween), which corresponds to the plateaus.

The amplitude and duration of the crystallizing thermal pulse can be selected to crystallize the desired number of phase change memory layers 22. Each such number corresponds to a different stored bit value for the memory material 20, and produces a different, generally distinct resistivity value $R_n$ (which in actuality is a small range of resistivity values along one of the plateaus $P_n$) that is stable and easily detectable and differentiated from resistivity values for other stored bit values. Ideally, the crystallizing thermal pulse will program the memory material 20 near the center of one of the plateaus ($P_n$), which provides a relatively large margin of error. In fact, it may be possible to monitor the resistivity of the memory material 20 as it is being programmed (by detecting changes in program current or voltage), so that programming on or near inflection points (IP) can be avoided. However, given that the stacked memory material 20 exhibits relatively stable resistivity values over discrete ranges of the crystallizing thermal pulse, programming is more reliable and program verification schemes used by single layer memory material devices can be avoided.

To read a stored value in the memory device 18, an electrical current is passed through it having an amplitude and/or duration that is insufficient to program the memory material 20, but is sufficient to measure its resistivity. The exemplary memory material (having four phase change material layers 22) can ideally store up to five different possible bit values, each exhibiting one of five possible discrete resistances. As shown in FIG. 5, a measured resistivity of $R_1$ indicates that none of the phase change memory layers 22 were crystallized. A measured resistivity of $R_2$ indicates that one of the phase change memory layers 22 were crystallized. A measured resistivity of $R_3$ indicates that two of the phase change memory layers 22 were crystallized, and so on. The programmed bit value is maintained by the memory material 22 until it is reprogrammed.

Figure 6:
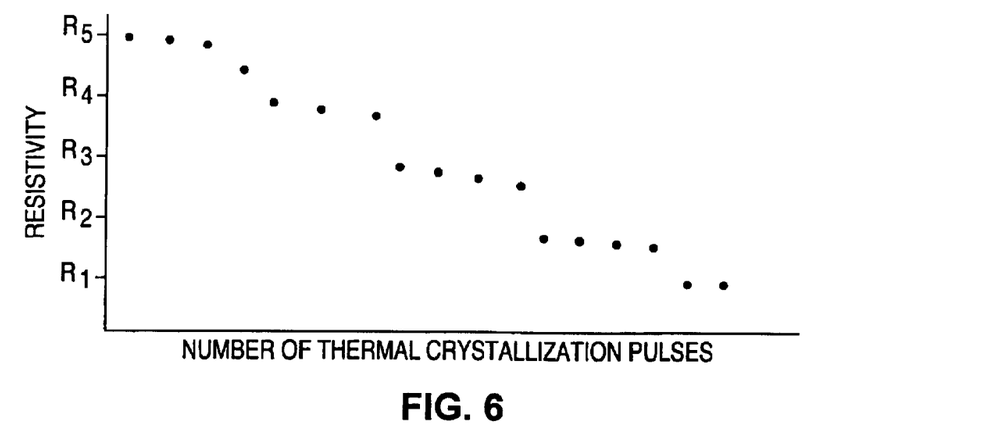
FIG. 6 is a graph showing the resistivity of the memory material of the present invention as a function of the number of crystallizing thermal pulses.

Programming via crystallization can also be performed using a plurality of discrete, shorter crystallizing thermal pulses (e.g. 0.05 to 10 microseconds in length), where the number of such pulses dictates the amount of memory material 22, and thus the number of layers 22, that are crystallized. The memory material 20 is crystallized in a piece-wise manner, layer by layer, until the desired number of layers 22 are crystallized. FIG. 6 illustrates the relationship between the number of crystallizing thermal pulses and the resulting resistivity. The advantage of using a plurality of crystallizing thermal pulses is that the resistivity of the memory material 20 can be measured between such pulses, to verify exactly how many layers 22 have been crystallized, and to avoid leaving the memory material programmed near an inflection point ($IP_n$).

Figure 7:
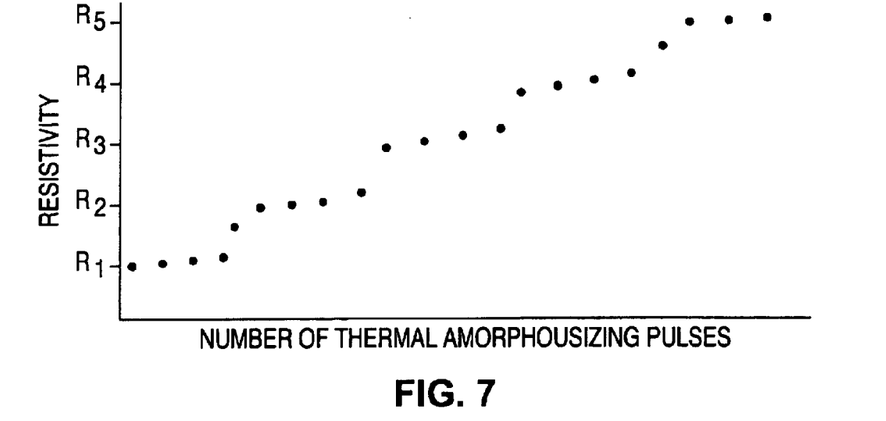
FIG. 7 is a graph showing the resistivity of the memory material of the present invention as a function of the number of amorphousizing thermal pulses.

Programming via amorphousization is the same as programming via crystallization, except that the memory material 20 starts in a completely crystallized state. If needed, a long (preferably DC) electrical pulse is passed through the memory device 18 to generate a crystallizing thermal pulse that crystallizes all of the phase change material layers 22 (e.g. 0.1 to 1 second in length). This DC pulse could be divided into two pulses, bi-directionally applied to ensure full crystallization of the memory material 20. Shorter electrical pulses (e.g. 0.01 to 0.1 msec in length) are then applied to the memory device 18, which generate amorphousizing thermal pulses that amorphousize the memory material 20 in a piece-wise, layer by layer manner, until the desired number of layers 22 are amorphousized. The instantaneous resistivity of the memory material as a function of the number of amorphousizing thermal pulses is shown in FIG. 7. Because amorphousizing the memory material 20 requires short thermal pulses, it is usually better to use multiple amorphousizing thermal pulses to ensure the multiple layers of phase change material are fully amorphousized.

Figure 8A:
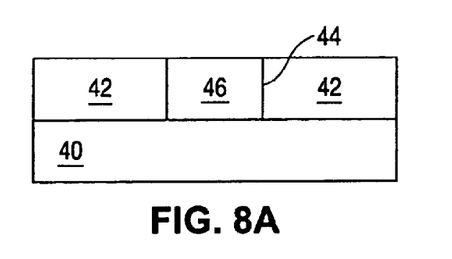
FIGS. 8A to 8C are cross-sectional views illustrating the process of forming a phase change memory device of the present invention.
Figure 8B:
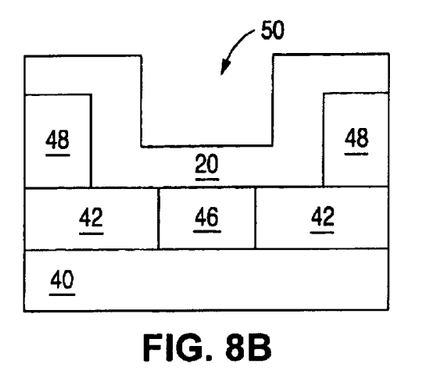
Figure 8C:
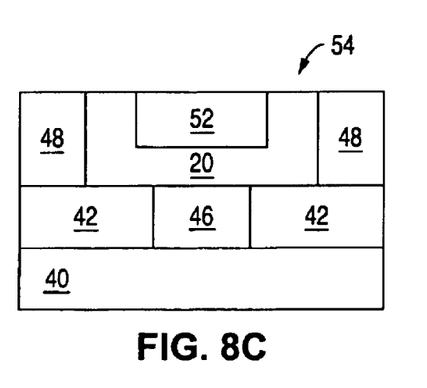

A method of forming a memory cell containing memory material 20 of the present invention is illustrated in FIGS. 8A–8C, and begins by forming a layer 42 of insulation material (e.g. one or more layers of silicon dioxide—"oxide", silicon nitride—"nitride", ILD, etc.) over a substrate 40 using a conventional deposition process. A first contact hole 44 is formed in the insulation material 40 using a conventional lithographic etch process. Contact hole 44 is then filled with a conductive material (e.g. tungsten, titanium-tungsten, etc.) by material deposition followed by a CMP (chemical-mechanical polishing) etch back process (using insulation material 42 as an etch stop), leaving a conductive lower electrode 46 in the first contact hole 44, as shown in FIG. 8A. Another layer of insulation material 48 is formed over the structure, and a second contact hole 50 is formed therein that extends down to and exposes lower electrode 46 and preferably some of first insulation layer 42 (i.e. second contact hole 50 is preferably larger in diameter than the first contact hole 44). The memory material 20 (which includes the plurality of phase change layers 22 and interlaced interface layers 24 shown in FIG. 3) is then formed over the structure using a plurality of deposition processes, as shown in FIG. 8B. Conductive material is then formed over the structure, followed by a CMP etch process (using insulation 48 as an etch stop, to remove the conductive material (and portions of memory material 20) disposed outside of second contact hole 50, leaving a conductive upper electrode 52 formed over the memory material 20. The resulting memory cell 54 is illustrated in FIG. 8C. Arrays of such memory cells can be simultaneously formed over the same substrate.

Figure 9A:
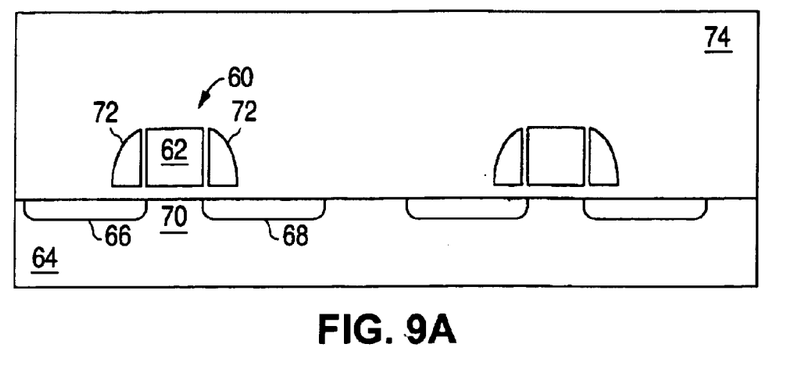
FIGS. 9A to 9F are cross-sectional views illustrating the process of forming a first alternate embodiment of the phase change memory device of the present invention.

FIGS. 9A to 9F illustrate an alternate embodiment of the present invention, which is a method of forming a memory cell that contains the memory material 20, and focuses the generated heat to minimize the amount of memory material 20 that needs to be programmed. FIG. 9A illustrates well known MOS FET transistors 60, the formation of which is well known in the art and not described herein in any detail. The MOS FET transistors 60 each include a conductive gate 62 formed over and insulated from a silicon substrate 64. Source and drain regions 66/68 (i.e. first and second regions that are interchangeable) are formed in the substrate 64 and have a conductivity type (e.g. N type) different from that of the substrate 64 (e.g. P type). The channel region 70 of the substrate is defined between the source and drain regions 66/68, and is selectively made conductive ("turned on and off") by varying the voltage on gate 62. Insulation spacers 72 are formed laterally adjacent to the gate 62, and are used to help form LDD (lightly doped) portions of the source and drain regions 66/68, which is well known in the art. Gate 62 and spacers 72 are surrounded by insulation material 74, which is typically formed from one or more layers of insulation materials (e.g. oxide, nitride, ILD, etc.).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

Figure 9B:
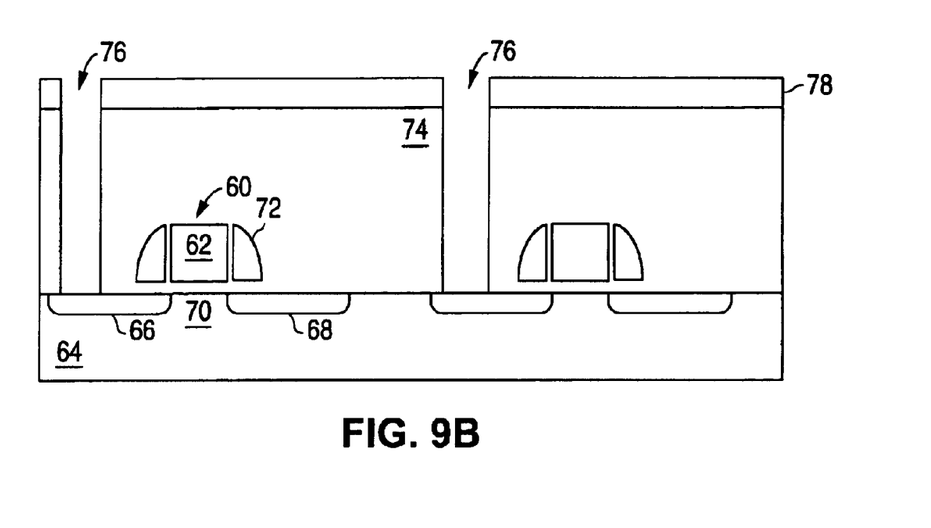

Starting with the structure shown in FIG. 9A, a plurality of memory cells are formed in the following manner, with each memory cell being formed adjacent to one of the transistors 60. Contact holes 76 are formed into the insulation material 74 using a lithographic etch process, where photo resist material 78 is formed over the insulation material 74, and portions thereof are removed to expose selected portions of the insulation material 74. An anisotropic etch process follows, which removes the exposed portions of insulation material 74 to form contact holes 76 that extend down to and expose the source regions 66 of the substrate 64. The resulting structure is shown in FIG. 9B.

Figure 9C:
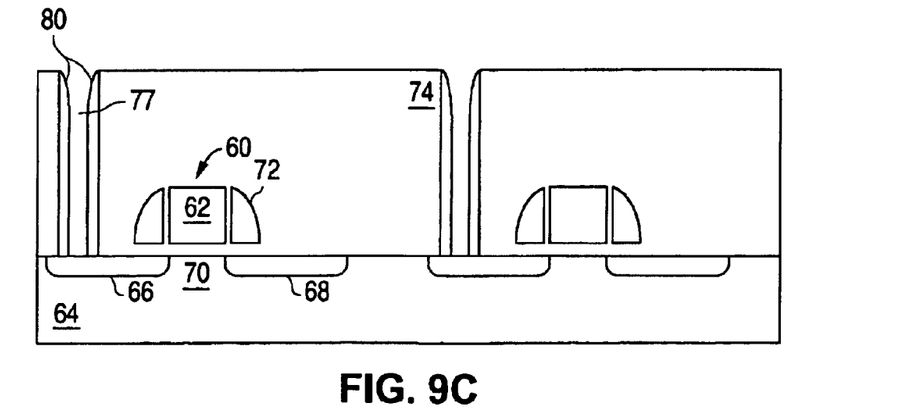

After the photo resist 78 is removed, spacer material 80 is formed in the contact holes 76. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. The upper surface of the spacer material curves downwardly in a generally rounded manner as it extends away from the structure against which it is formed. Thus, when spacers are formed in holes, opposing portions of the spacer material extend toward each other creating a central opening having a width or diameter that decreases with depth (i.e. funnel shaped). Spacer material 80 can be formed of any dielectric material, such as oxide, nitride, ILD, etc. In the present example, spacer material 80 is formed of nitride by depositing a layer of nitride over the entire structure followed by an anisotropic nitride etch process, such as the well known Reactive Ion Etch (RIE), to remove the deposited nitride except for spacer material 80 formed along the sidewalls of contact openings 76, as shown in FIG. 9C. The spacer material defines an opening 77 having a width that narrows with depth, and is less than that defined by the lithographic process that originally formed the contact holes 76 (e.g. by as much as 80% or more).

Figure 9D:
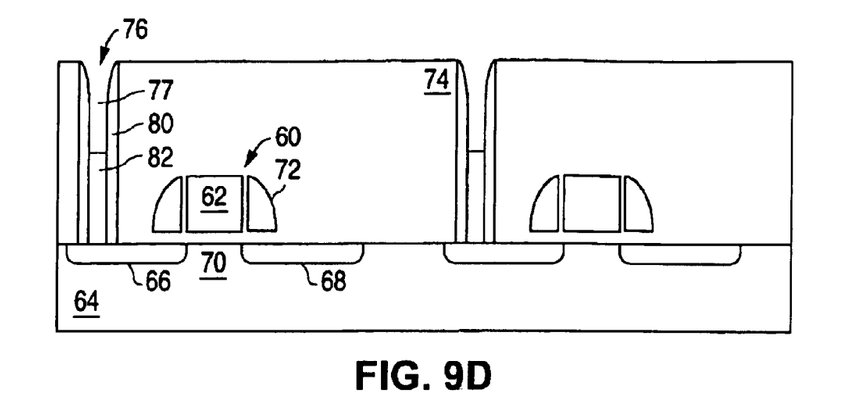
Figure 9E:
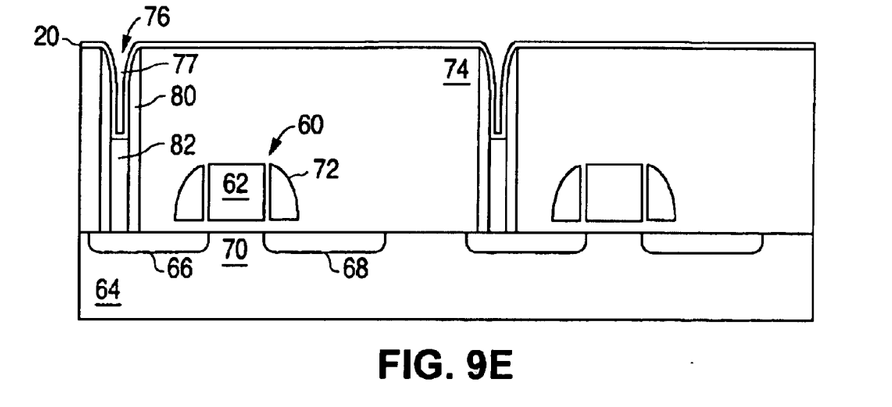

A thick layer of conductive material (e.g. tungsten, titanium-tungsten, etc.) is deposited over the structure, which fills the openings 77 in contact holes 76 with the conductive material. A CMP (chemical-mechanical polishing) etch follows using the top surface of the insulation material 74 as an etch stop, which removes the conductive material except for blocks 82 thereof inside contact holes 76. A controlled etch process is then used to recess the tops of blocks 82 below the top surface of the insulation material 74, as illustrated in FIG. 9D. After the structure is cleaned to remove all etch residue, polymers, etc., a thin layer of the memory material 20 (which includes the plurality of phase change layers 22 and interlaced interface layers 24 shown in FIG. 3) is formed over the structure, including inside openings 77 (along spacer material 80 and on blocks 82), as shown in FIG. 9E. For this embodiment, the memory material 20 is preferably thin enough so that it does not merge together as a single vertical column in each contact hole 76 as it extends down to and covers block 82.

Figure 9F:
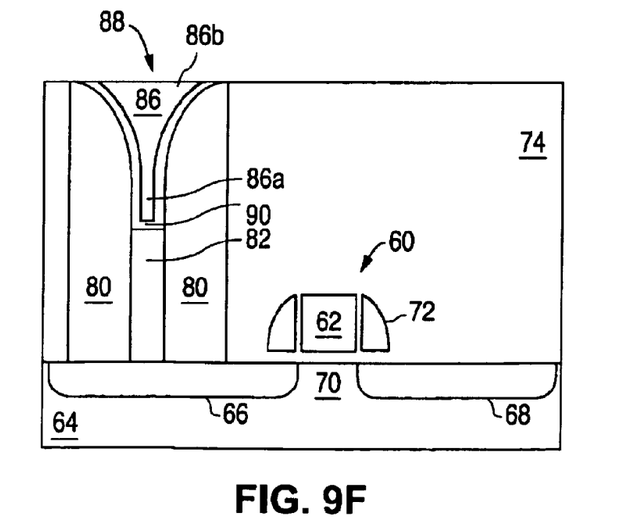

Another thick layer of conductive material (e.g. tungsten, titanium-tungsten, etc.) is deposited over the structure, filling openings 77 in contact holes 76. A CMP etch follows using the top surface of the insulation material 74 as an etch stop, which removes those portions of the conductive material and memory material 20 that are disposed outside of contact holes 76, and results in blocks 86 of the conductive material disposed in contact holes 76 and over memory material 20, as shown in FIG. 9F. The resulting structure preferably includes rows of memory cells 88 and their associated transistors 60. The conductive material used to form blocks 86 can be selected and/or doped (e.g. by ion implant or by in-situ process) for increased resistivity, to enhance the heat generated thereby during operation, as explained in further detail below.

As shown in FIG. 9F, blocks 82 and 86 constitute the memory cell's lower and upper electrodes, respectively, which are used to program the memory material 20 therebetween. Upper electrode 86 has a width that narrows as it extends down toward the lower electrode 82 (i.e. has a lower portion 86a that is narrower than an upper portion 86b). This narrowing of the electrode width is caused by the shape of the spacer material 80, against which the memory material 20 and upper electrode 86 are formed. The upper electrode 86 (and memory material 20 adjacent thereto) define a narrowing current path for the memory cell 88 that reaches its smallest width at the portion thereof 90 disposed directly above the lower electrode 82.

To program the memory cell 88, a voltage is applied across upper electrode 86 and drain region 68, and a voltage is applied to gate 62 to turn on channel region 70, so that an electrical current pulse of predetermined amplitude and duration flows through transistor 60, lower electrode 82, memory material 20 and upper electrode 86. The electrical current pulse flowing through upper electrode 86 generates a thermal pulse, which is concentrated in the lower portion 86a thereof where there is the greatest current density. The thermal pulse heats the memory material 20, and in particular the lower portion 90 thereof that is disposed between the narrowest portion of upper electrode 86 and lower electrode 82. The various phase change material layers 22 of the memory material 20 are amorphousized or crystallized by the thermal pulse as described above.

To read the memory cell 88, an electrical current is passed through the memory cell 88 that has an amplitude and/or duration that is insufficient to program the memory cell 88, but is sufficient to measure its resistivity. Various measured resistivity values (corresponding to various crystallized or amorphousized states of phase change material layers 22), represent the programmed bit values. These values are maintained by the memory cells until the memory cells 88 are reprogrammed. The memory cells 88 are preferably formed in an array configuration, with the upper electrodes 86, drain regions 68 and gates 62 connected in row or column connection lines, so that each memory cell 88 can be individually programmed and read without disturbing adjacent memory cells.

Using spacers 80 to taper (narrow) down the width of heating electrode 86, and using a thin layer (with sublayers) of the programmable memory material disposed at the thin tip of the heating electrode 86, reduces both the width and depth of the programmed memory material in the memory cell, thus reducing the electrical current (and overall power consumption) needed to program the memory device. The narrowing current path focuses much of the generated heat on that portion of the memory material 20 directly between the upper and lower electrodes 86/82. Surrounding the heating electrode 86 with spacers 80 also increases the distance (and therefore thermal isolation) between heating electrodes and memory material from adjacent cells.

Figure 10:
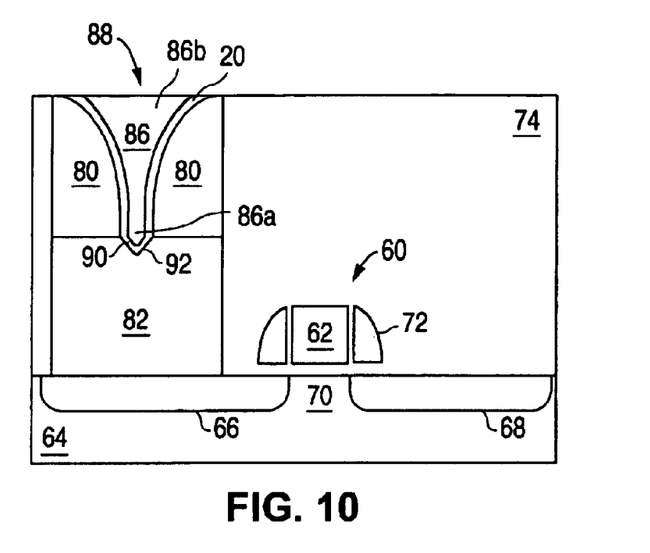
FIG. 10 is a cross-sectional view of a second alternate embodiment of the phase change memory device of the present invention.

FIG. 10 illustrates a second alternate embodiment of the present invention, where the lower electrode 82 is formed before the formation of the spacers 80. In this embodiment, the lower electrode width is not reduced by the spacers 80. This allows for the optional formation of an indentation 92 into the upper surface of the lower electrode (e.g. by Ar sputtering on the portion of lower electrode 82 left exposed by the spacer material 80 before the formation of the memory material layer). This indentation 92 sharpens the tip of upper electrode lower portion 86a, and better focuses the heat generation at the memory material portion 90 disposed directly in-between this tip and the lower electrode 82.

Figure 11A:
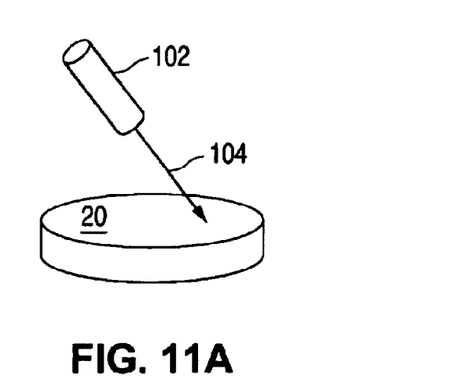
FIGS. 11A to 11B are perspective views illustrating the optical programming and reading of the phase change memory material of the present invention.
Figure 11B:
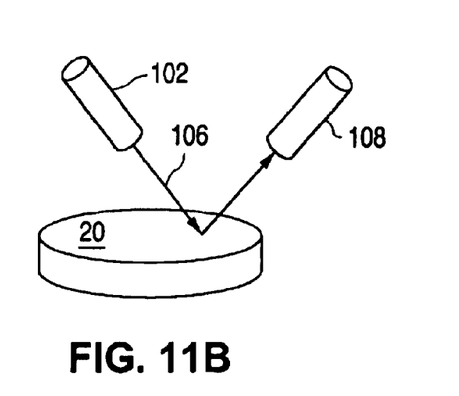

Asymmetrical heating of the multi-layer memory material 20 of FIG. 3 is not limited to heat generated from electrical current, but could also include heat generated by incident irradiation. For example, FIG. 11A illustrates memory material 20 formed on a disk shaped substrate, where a laser 102 produces a write beam 104 that selectively heats portions of memory material 20 (i.e. in a manner similar to conventional DVD and R/W CD devices). Amorphousizing/crystallizing thermal pulses of desired amplitude and duration are created for each storage location on the disk shaped substrate by pulsing the laser output and/or rotating the substrate, to program the different areas of the memory material 20 with multi-bit information (as described above). The laser 102 can then emit a low power read beam 106 that reflects off of the memory material 20 and into a sensor 108, which measures a property of the reflected beam (e.g. polarization, amplitude, pulsed beam characteristics, etc.) that varies depending upon how many layers 22 are amorphousized or crystallized, as shown in FIG. 11B. In this manner, each storage location on the disk can be programmed with any of three or more possible bit values, instead of just two possible bit values as is done with conventional disk drive storage devices.

It is to be understood that the present invention is not limited to the embodiment(s) described above and illustrated herein, but encompasses any and all variations falling within the scope of the appended claims. For example, the number of phase change material layers 22 with the memory material 20 can vary. The contact holes 86 are preferably circular with annular spacer material 80 evenly formed about an open center. However, contact holes can take any shape (elongated, trench-like, elliptical, oval, etc.). The formation of the spacer material 80 can include several successive material deposition/etch processes, to narrow contact hole 76 down to any desired width/diameter. The transistor associated with each memory cell need not be disposed laterally adjacent the memory as shown in the figures, and could even be formed underneath the memory cell between the lower electrode and the substrate. While the upper electrode 86 and memory material 20 are formed in opening 77 (and contact hole 76), at least some portions of these elements can extend out of opening/hole 77/76 as well. Lastly, any heating element(s) that can create the temperature gradient across the memory material can be used, including a heating element (e.g. upper electrode 26) that is heated by electrical current that is not passed through the memory material during programming, or heating elements/compositions within the memory material itself.

What is claimed is:

1. A phase change memory device, comprising:
   a volume of memory material that includes:
      a plurality of discrete layers of phase change material, and
      a discrete layer of interface material disposed between each pair of adjacent phase change material layers, wherein the interface material is formed of a lattice mismatch material relative to the phase change material; and
   means for applying heat to the memory material volume;

wherein a resistivity of the memory material is programmable to one of a plurality of generally distinct resistivity values in response to the heat applied to the memory material.

2. The phase change memory device of claim 1, wherein each of the phase change material layers includes a chalcogenide material.

3. The phase change memory device of claim 1, wherein the number of generally distinct resistivity values of the memory material volume exceeds by one the number of the phase change material layers in the memory material volume.

4. The phase change memory device of claim 1, wherein as the heat is applied over time to the memory material, the memory material exhibits periods of slower crystallization or amorphobsization corresponding to the generally distinct resistivity values, and periods of faster crystallization or amorphousization corresponding to resistivities between the generally distinct resistivity values.

5. The phase change memory device of claim 1, wherein as the heat is applied to the memory material, the plurality of phase change material layers are crystallized or amorphousized generally in a sequential manner.

6. The phase change memory device of claim 1, wherein the means for applying the heat applies the heat as one or more thermal pulses.

7. The phase change memory device of claim 1, wherein the means for applying heat comprises a laser that directs a first laser beam onto the memory material volume.

8. The phase change memory device of claim 7, wherein the laser directs a second laser beam onto the memory material volume, and the phase change memory device further comprises:
an optical sensor that measures a property of the second laser beam after the second laser beam reflects off of the memory material volume.

9. The phase change memory device of claim 1, wherein the means for applying heat comprises an electrode in electrical contact with the memory material volume, and wherein the electrode generates the heat as electrical current is passed therethrough.

10. The phase change memory device of claim 1, wherein the means for applying heat comprises a first electrode and a second electrode in electrical contact with the memory material volume, and wherein the heat is generated via electrical current passing through the first and second electrodes and the memory material volume.

11. The phase change memory device of claim 10, wherein the second electrode has a resistivity that is higher than that of the first electrode so that the second electrode generates the heat to create a temperature gradient across the memory material volume.

12. The phase change memory device of claim 10, further comprising:
a substrate;
insulation material formed over the substrate and including a hole formed therein;
spacer material disposed in the hole and having a surface that defines an opening having a width that narrows along a depth of the opening;
the first electrode is disposed in the hole and has an upper surface;
the volume of memory material is disposed in the opening and extends along the spacer material surface and at least a portion of the first electrode; and
the second electrode is disposed in the opening and on the volume of memory material;
wherein the second electrode and the volume of memory material form an electrical current path that narrows in width as the current path approaches the first electrode, so that electrical current passing through the current path generates the heat for heating the volume of memory material.

13. The phase change memory device of claim 12, wherein the current path reaches a minimum cross sectional area adjacent the first electrode upper surface.

14. The phase change memory device of claim 12, wherein the first electrode is disposed in the opening defined by the spacer material surface.

15. The phase change memory device of claim 12, wherein the spacer material is formed over the first electrode upper surface.

16. The phase change memory device of claim 15, wherein an indentation is formed into the first electrode upper surface, and a portion of the memory material volume extends into the indentation.

17. An phase change memory device, comprising:
a plurality of memory cells formed on a substrate, wherein each of the memory cells includes:
a volume of memory material that includes a plurality of discrete layers of phase change material, with a discrete layer of interface material disposed between each pair of adjacent phase change material layers, wherein the interface material is formed of a lattice mismatch material relative to the phase change material;
a first electrode in electrical contact with the memory material volume; and
a second electrode in electrical contact with the memory material volume, wherein the volume of memory material is disposed between the first and second electrodes such that electrical current passing through the first and second electrodes and the memory material volume generates heat that is applied to memory material;
wherein a resistivity of the memory material in each of the memory cells is programmable to one of a plurality of generally distinct resistivity values in response to the heat applied thereto.

18. The phase change memory device of claim 17, wherein each of the phase change material layers includes a chalcogenide material.

19. The phase change memory device of claim 17, wherein for each of the memory cells, the number of generally distinct resistivity values of the memory material volume exceeds by one the number of the phase change material layers in the memory material volume.

20. The phase change memory device of claim 17, wherein for each of the memory cells, as the heat is applied over time to the memory material, the memory material exhibits periods of slower crystallization or amorphousization corresponding to the generally distinct resistivity values, and periods of faster crystallization or amorphousization corresponding to resistivities between the generally distinct resistivity values.

21. The phase change memory device of claim 17, wherein for each of the memory cells, the second electrode has a resistivity that is higher than that of the first electrode so that the second electrode generates the heat to create a temperature gradient across the memory material volume.

22. The phase change memory device of claim 21, wherein for each of the memory cells, as the heat is applied to the memory material, the plurality of phase change material layers are crystallized or amorphousized generally in a sequential manner.

23. The phase change memory device of claim 17, wherein each of the memory cells further comprises:
- insulation material formed over the substrate and including a hole formed therein;
- spacer material disposed in the hole and having a surface that defines an opening having a width that narrows along a depth of the opening;
- the first electrode is disposed in the hole and has an upper surface;
- the volume of memory material is disposed in the opening and extends along the spacer material surface and at least a portion of the first electrode; and
- the second electrode is disposed in the opening and on the volume of memory material;
- wherein the second electrode and the volume of memory material form an electrical current path that narrows in width as the current path approaches the first electrode, so that electrical current passing through the current path generates the heat for heating the volume of memory material.

24. The phase change memory device of claim 23, wherein for each of the memory cells, the current path reaches a minimum cross sectional area adjacent the first electrode upper surface.

25. The phase change memory device of claim 23, wherein for each of the memory cells, the first electrode is disposed in the opening defined by the spacer material surface.

26. The phase change memory device of claim 23, wherein for each of the memory cells, the spacer material is formed over the first electrode upper surface.

27. The phase change memory device of claim 26, wherein for each of the memory cells, an indentation is formed into the first electrode upper surface, and a portion of the memory material volume extends into the indentation.

* * * * *